United States Patent
Yu

(10) Patent No.: US 7,619,202 B2
(45) Date of Patent: Nov. 17, 2009

(54) REMOTE-CONTROLLABLE ELECTRONIC DEVICE

(75) Inventor: Shih-Hung Yu, Lujhu Township, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 102 days.

(21) Appl. No.: 11/433,967

(22) Filed: May 15, 2006

(65) Prior Publication Data

US 2006/0257154 A1 Nov. 16, 2006

(30) Foreign Application Priority Data

May 16, 2005 (TW) .............................. 94115758 A

(51) Int. Cl.
*H01J 40/14* (2006.01)
(52) U.S. Cl. ..................... 250/215; 250/338.1; 250/239
(58) Field of Classification Search ................. 250/215, 250/338.1, 239
See application file for complete search history.

(56) References Cited

U.S. PATENT DOCUMENTS

| | | | | |
|---|---|---|---|---|
| 5,103,108 A | * | 4/1992 | Crimmins | 250/338.1 |
| 5,804,827 A | * | 9/1998 | Akagawa et al. | 250/370.06 |
| 2002/0096684 A1 | * | 7/2002 | Brandes et al. | 257/77 |
| 2002/0140360 A1 | * | 10/2002 | Crenshaw | 315/149 |
| 2004/0031274 A1 | * | 2/2004 | Cho et al. | 62/126 |

FOREIGN PATENT DOCUMENTS

DE 19637946 A1 * 3/1997

* cited by examiner

*Primary Examiner*—Georgia Y Epps
*Assistant Examiner*—Kevin Wyatt
(74) *Attorney, Agent, or Firm*—Snell & Wilmer L.L.P.

(57) ABSTRACT

A remote-controllable electronic device includes a casing, a filter, a sensor, and a shielding element. The casing is formed with a hole where the filter is embedded thereto. The sensor is disposed within the casing and configured to receive a light signal filtered by the filter. The shielding element is disposed in front of the sensor so as to specify a receiving range for receiving the light signal.

15 Claims, 5 Drawing Sheets

REMOTE-CONTROLLABLE ELECTRONIC DEVICE

CROSS-REFERENCE TO RELATED APPLICATIONS

This application claims the right of priority based on Taiwan Patent Application No. 94115758 entitled "Remote Controllable Electronic Device," filed on May 16, 2005, which is incorporated herein by reference and assigned to the assignee herein.

FIELD OF INVENTION

The present invention generally relates to a remote-controllable electronic device, and more particularly to a remote-controllable electronic device with a specified receiving range for a light signal.

BACKGROUND OF THE INVENTION

In parallel with the progress of technologies and the improvement of lifestyle, most electronic devices are improved with a remote control function. A remote-controllable electronic device is generally equipped with a remote control, which is configured to emit signals to be received by a sensor of the electronic device. Then, the electronic device is operated in response to the received signals. Therefore, what signals or the amount of the signals can be received by the sensor determines the remote controllability of the electronic device.

The remote control generally emits signals within a predetermined frequency band, such as infrared signals. The sensor is designed to respond substantially only to the signals within the predetermined frequency band. A conventional remote-controllable electronic device typically has a casing formed with a hole corresponding to the position of the sensor so that the sensor is allowed to receive light signals. Moreover, in order to improve the exterior appearance of the electronic device, the hole is generally integrated with a cover. In some cases, the cover is made of materials transparent to lights and designed with larger size to increase the signal-receivable range of the sensor. However, in such arrangement, the possibility of receiving non-remote control signals, i.e. signals not emitted by the remote control (noise), is accordingly increased. The influence of noise becomes serious when the noise is within the receivable range of the sensor. More seriously, the electronic device might malfunction due to the noise.

Therefore, it is desirable to provide a remote-controllable electronic device with a specified receiving range, which imposes lesser restriction on the design of exterior appearance.

SUMMARY OF THE INVENTION

One aspect of the present invention is to provide a remote-controllable electronic device having a receiving range for a light signal reconfigured at low cost without the need of new moldings for existing components.

Another aspect of the present invention is to provide a remote-controllable electronic device, which includes a filter for filtering a light signal received by a sensor and a shielding element for adjusting a receiving range for the light signal so that noise signals received by the sensor are reduced and the performance of the remote control is improved.

In one embodiment, the present invention provides a remote-controllable electronic device including a casing, a filter, a sensor, and a shielding element. The casing is formed with a hole, and the filter is embedded to the hole of the casing. The sensor is disposed within the casing and configured to receive a light signal filtered by the filter. The shielding element is disposed in front of the sensor so as to specify a receiving range for the light signal received by the sensor.

Moreover, in an exemplary embodiment, the casing further includes a protrusion and the filter includes a cavity. The protrusion is engaged with the cavity when the filter is embedded to the hole of the casing. In an exemplary embodiment, the shielding element is disposed between the filter and the sensor so as to hinder a portion of the filtered light signal from being received by the sensor. In another exemplary embodiment, the shielding element can be adhered to the filter or a coating material coated on the filter. The shielding element is disposed to define a portion of the filter as being a predetermined geometric shape, such as a circle, an oval, or a rectangle.

Furthermore, the receiving range includes a horizontal receiving range and a vertical receiving range. In an exemplary embodiment, the shielding element is disposed so that the horizontal receiving range is larger than the vertical receiving range. In another exemplary embodiment, the shielding element is disposed so that the horizontal receiving range is substantially equal to the vertical receiving range.

BRIEF DESCRIPTION OF THE DRAWINGS

The foregoing objects and other objects together with the advantages of this invention will become more readily appreciated as the same becomes better understood by reference to the following detailed description, when taken in conjunction with the accompanying drawings, wherein.

DETAILED DESCRIPTION

The present invention provides a remote-controllable electronic device with a specified receiving range for a light signal, which imposes lesser restriction on exterior appearance and is capable of reducing noise so as to improve the remote controllability. Preferred embodiments of the present invention are illustrated in FIGS. 1 to 5.

Figure 1:
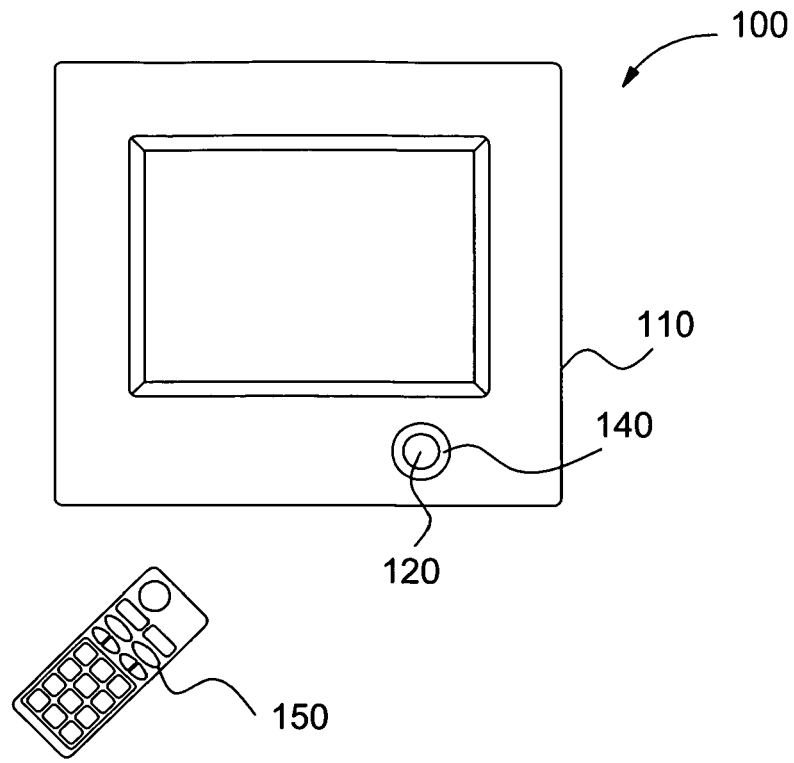
FIG. 1 illustrates a schematic view of a remote-controllable electronic device according to one embodiment of the present invention.
Figure 2:
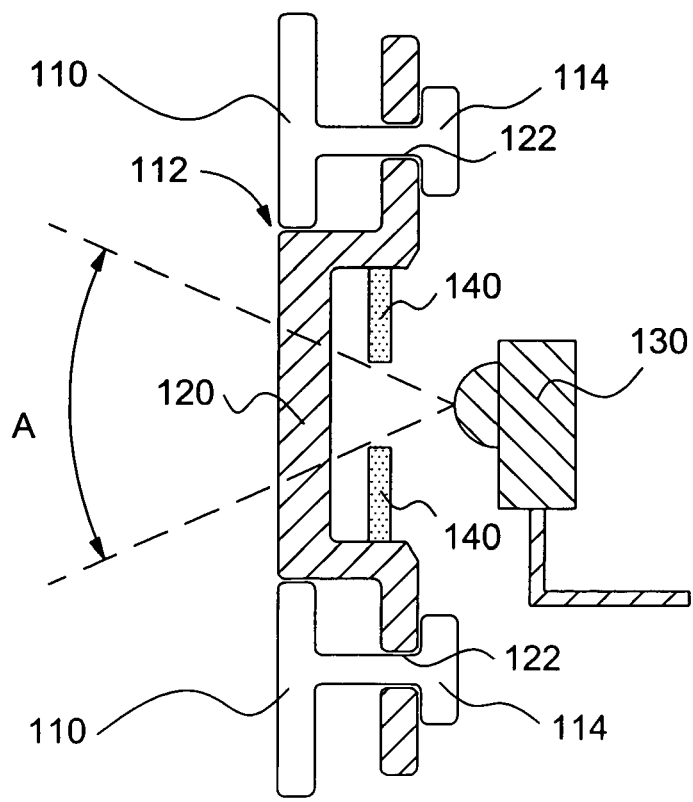
FIG. 2 illustrates a partially enlarged cut-away view of the device of FIG. 1.

Referring to FIGS. 1 and 2, in one embodiment, the present invention provides a remote-controllable electronic device 100, which can be any electronic device with remote control functionality, for example, electronic appliances such as televisions, stereos, video players, etc. In one exemplary embodiment, the remote-controllable device 100 is but not limited to a flat panel television, such as LCD television. The remote-controllable device 100 includes a casing 110, a filter 120, a sensor 130, and a shielding element 140. The casing 110 is formed with a hole 112. The casing 110 can be formed by using conventional molding materials, such as plastics. The filter 120 is typically embedded to the hole 112 of the casing 110. The casing 110 is generally made of opaque materials so that light signals enter into the casing 110 substantially only through the filter 120.

FIG. 2 illustrates a partially enlarged cross-sectional view of the remote-controllable device 100 of FIG. 1. As shown in FIG. 2, the casing 110 further includes a protrusion 114, and the filter 120 includes a cavity 122. The diameter of the protrusion 114 is substantially equal to or slightly less than that of the cavity 122. When the filter 120 is embedded to the hole 112 of the casing 110, the protrusion 114 is engaged with the cavity 122, and therefore, the filter 120 is affixed to the casing 110. Moreover, in another embodiment, by performing a thermal melting process, the tip of the protrusion 114 can be soften and deformed to a shape with a diameter larger than that of the cavity 122 so as to further enhance the connection between the filter 120 and the casing 110. In such an arrangement, the filter 120 is affixed to the casing 110 and embedded to the hole 112. In other words, at least a portion of the filter 120 is inserted to a portion of the casing 110, which is transparent to lights, i.e. the hole 112. It is noted that the filter 120 can be affixed to the casing 110 in various ways, such as using adhesives, screws, or any conventional connection method as appropriate.

In one exemplary embodiment, the filter 120 can be made of a predetermined plastic, which allows substantially only a predetermined frequency band of light signal transmitting therethrough. The sensor 130 is disposed within an internal space defined by the casing 110 and configured to receive a light signal filtered by the filter 120. The sensor 130 can be any conventional sensor, which is configured to receive a specific frequency band of light signal, such as infrared signals emitted by a remote control 150. As such, the filter 120 can filter out most light signals outside the receivable frequency band range of the sensor 130 so as to improve the sensitivity of the sensor 130. The shielding element 140 is disposed in front of the sensor 130 so as to specify a receiving range (A) of the light signal received by the sensor 130. As shown in FIG. 2, in one embodiment, the shielding element 140 is disposed between the filter 120 and the sensor 130 so as to hinder a portion of the filtered light signal from being received by the sensor 130. That is, when the filter 120 is designed with larger size for better exterior appearance, the sensor 130 is susceptible to environmental noise. By implementing the shielding element 140, the receivable range of the sensor 130 for the light signal can be reduced to lower the possible influence induced by the environmental noise, and accordingly the relative strength of remote control signals is increased. Furthermore, when environmental noise includes light signals within the receivable frequency band range similar to that emitted by the remote control 150, such as lights emitted by illumination device, the shielding element 140 can be used to effectively hinder light signals coming from a specific direction.

Figure 3A:
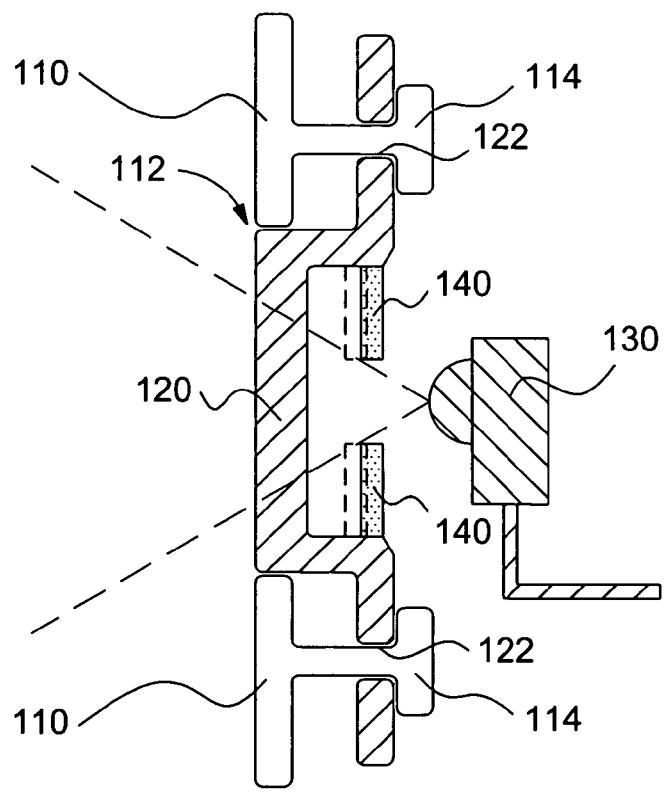
FIGS. 3A-3C illustrate schematic partially enlarged views in accordance with other embodiments of the present invention.
Figure 3B:
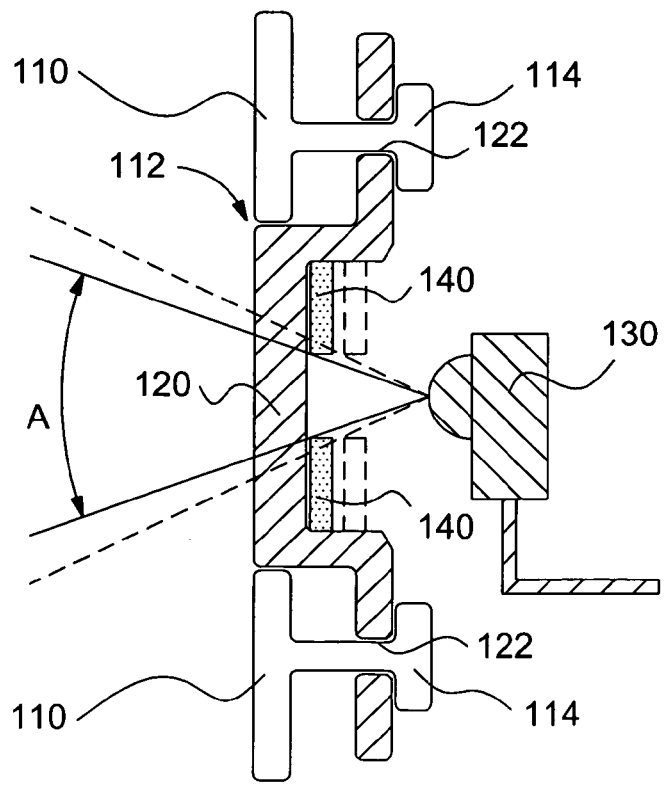
Figure 3C:
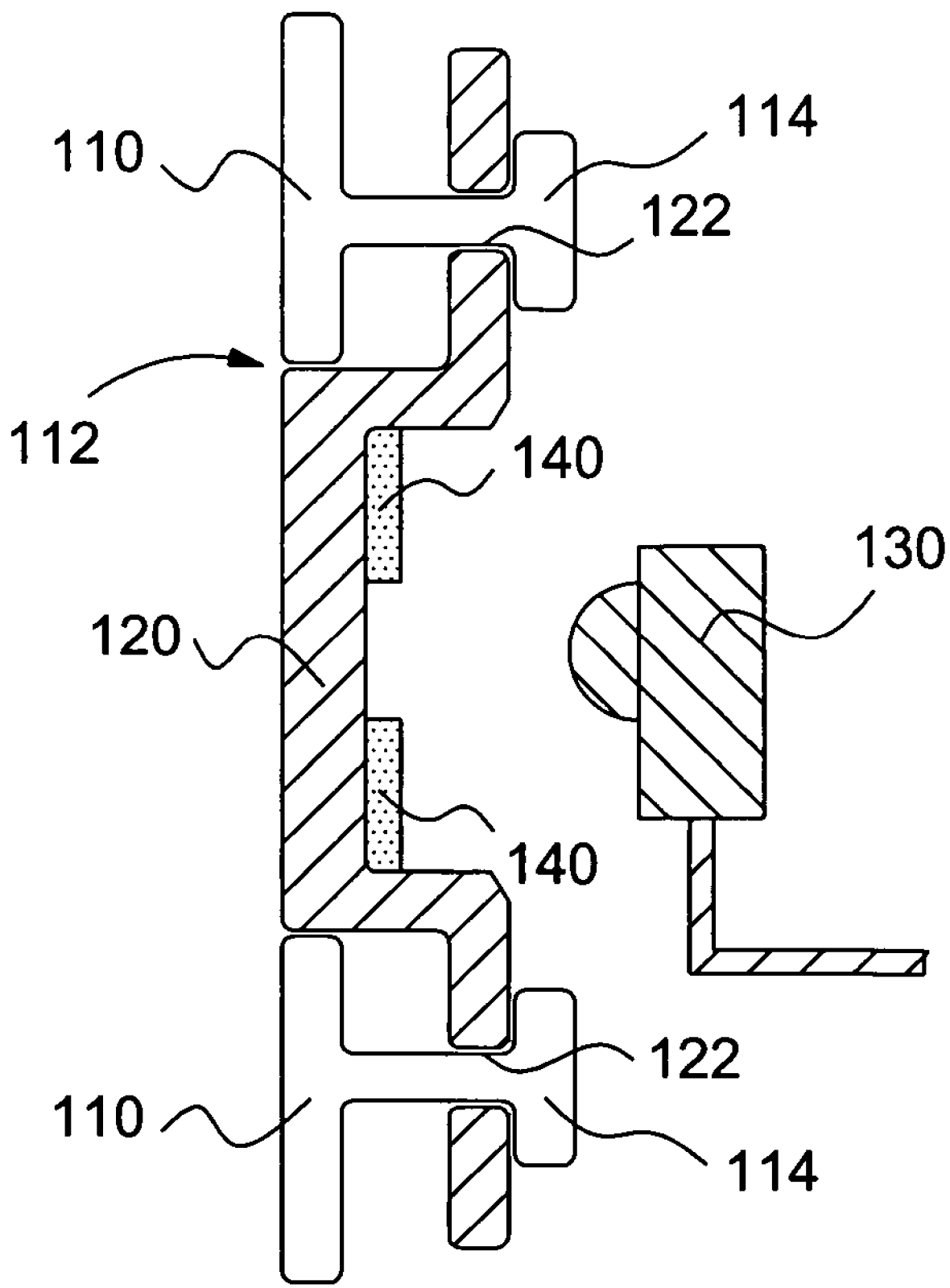

In another embodiment, the shielding element 140 is movable to adjust a relative position between the shielding element 140 and the sensor 130 so that the receiving range for the light signal can be adjusted. For example, as shown in FIG. 3A, when the shielding element 140 moves toward the sensor 130, the receiving range for the light signal is increased. Alternatively, as shown in FIG. 3B, when the shielding element 140 moves away from the sensor 130, i.e. closer to the filter 120, the receiving range for the light signal is decreased. As shown in FIG. 3C, in another embodiment, the shielding element 140 is adhered to the filter 120. For the shake of promoting the exterior appearance of the remote-controllable device 100, the shielding element 140 is preferably disposed on the filter 120 inside the casing 110. Alternatively, in another exemplary embodiment, the shielding element 140 includes a coating material coated on the filter 120. It is noted that the shielding element 140 can be made of any material suitable for hindering a predetermined frequency band signals and not limited to plastics or coating materials.

Figure 4A:
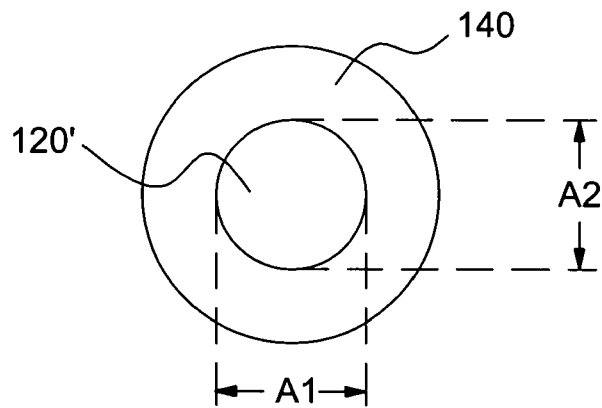
FIGS. 4A-4C illustrate schematic views showing that a shielding element is disposed to define a portion of a filter as being a predetermined geometric shape in accordance with embodiments of the present invention.
Figure 4B:
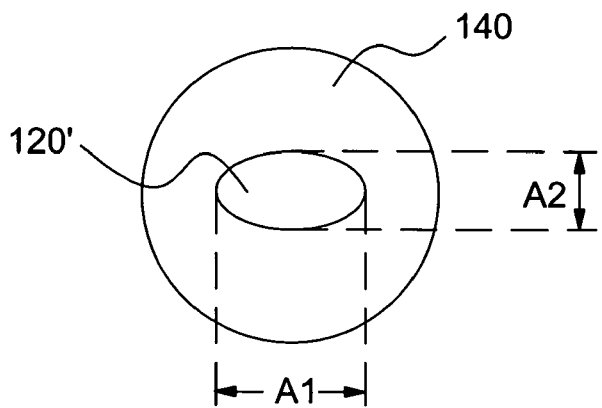
Figure 4C:
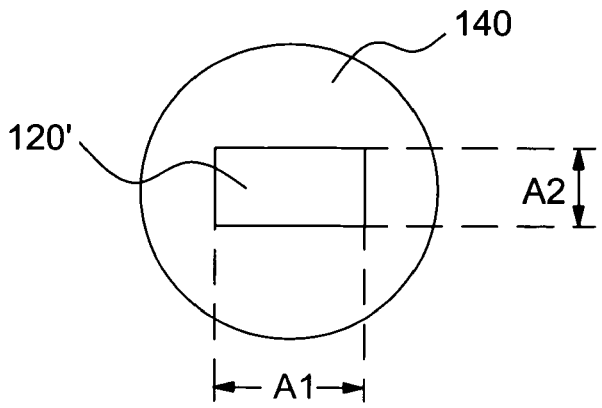

Referring to FIGS. 4A, 4B, and 4C, the shielding element 140 is disposed to define a portion of the filter 120 as being a predetermined geometric shape. As shown in FIG. 4A, the shielding element 140 is disposed to define a portion of the filter (120') as being a circle. For example, the receiving range comprises a horizontal receiving range (A1) and a vertical receiving range (A2). The shielding element 140 is so disposed that the horizontal receiving range is substantially equal to the vertical receiving range. For example, the horizontal receiving range (A1) or the vertical receiving range (A2) is preferably larger than 60 degrees. As such, the sensor 130 can effectively receive the signals emitted by the remote control 150 while the environmental noise is mostly hindered. In an alternative embodiment, the shielding element 140 is so disposed that the horizontal receiving range (A1) is substantially larger than the vertical receiving range (A2). As shown in FIGS. 4B and 4C, the shielding element 140 is disposed to define a portion of the filter (120') as being an oval or a rectangle. When the environmental noise mostly comes from the illumination device, which is generally mounted on the ceiling or at a location higher than the remote-controllable device 100, the vertical receiving range (A2) designed to be smaller than the horizontal receiving range (A1) can effectively hinder the noise from the vertical direction without lowering the receivable range in the horizontal direction. Preferably, the horizontal receiving range (A1) is larger than 60 degrees, and the vertical receiving range (A2) is not less than 60 degrees. It is noted that the vertical receiving range (A2) can be designed as being less than 60 degrees to more effectively hinder the noise in a specific condition, however, it might also affect the remote controllability of the electronic device 100. Though the filter 120 is exemplarily illustrated as a circle, the shape of the filter 120 can be varied to cope with different design needs. Additionally, the portion of the filter 120' can be different shape in accordance with the design requirement or the source of the noise and is not limited to the illustrated embodiments.

Figure 5:
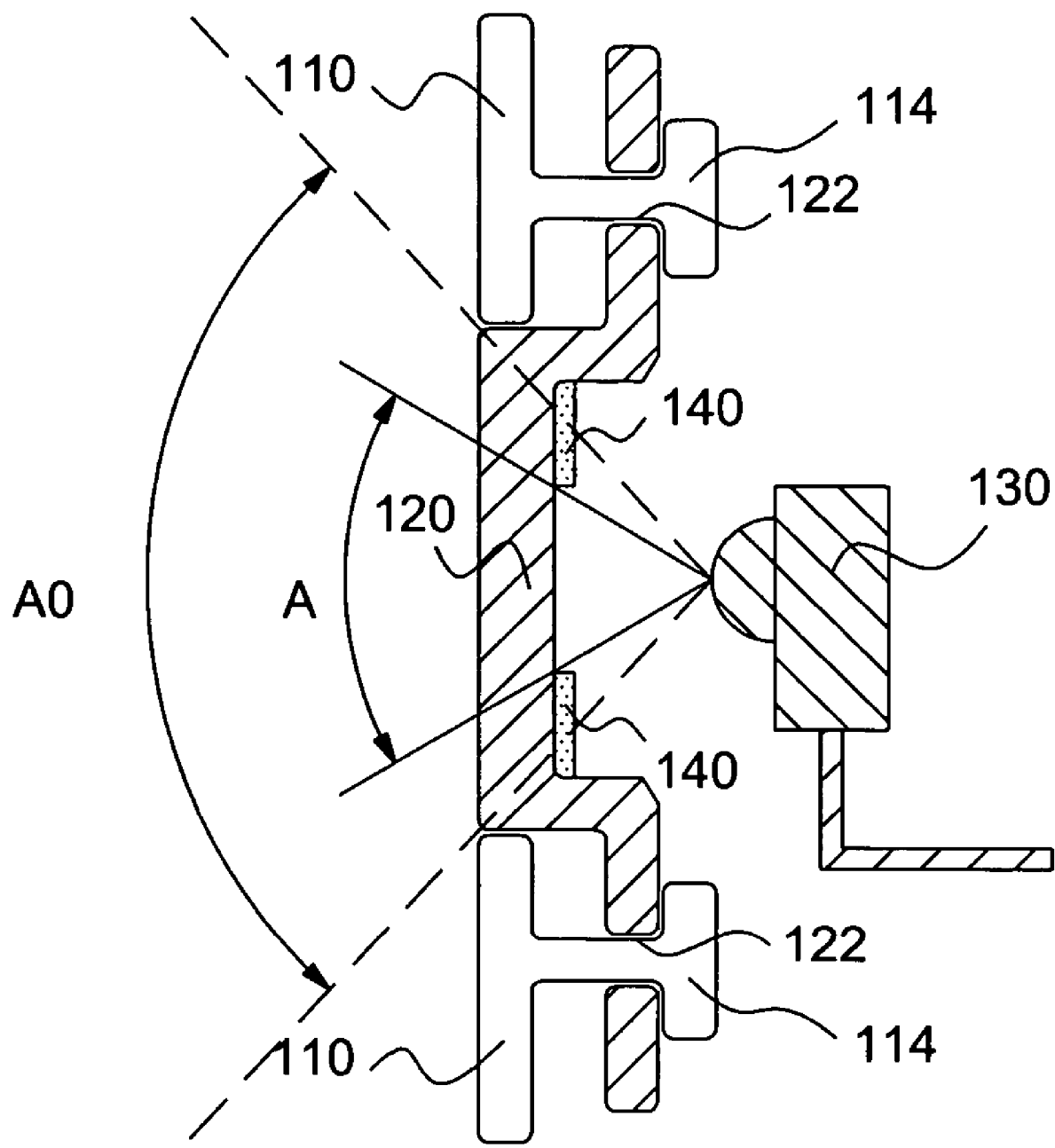
FIG. 5 illustrates a schematic view showing that a receiving range is specified by a shielding element in accordance with one embodiment of the present invention.

Referring to FIG. 5, a schematic view showing the receiving range is reconfigured by use of the shielding element 140 in one embodiment of the present invention. If the remote-controllable electronic device is provided without the shielding element 140, the receiving range (A0) of the sensor 130 is defined by the filter 120, indicated as A0 in FIG. 5. When the filter 120 is designed with larger size due to exterior appearance design need or the remote-controllable electronic device 100 is located in an environment with lots of noise, such as light from the illumination device, the present invention utilizes the shielding element 140 to reconfigure the receiving range for the light signal received by the sensor 130, indicated as A in FIG. 5. In other words, by implementation of the shielding element 140, the receiving range of the remote-controllable electronic device 100 for the light signal is reconfigured at low cost without the need of a new molding either for the casing 110 or the filter 120. Consequently, the remote-controllable electronic device 100 of the present invention efficiently resolves the issue induced by environment noise without trading off the exterior appearance.

Although specific embodiments have been illustrated and described, it will be apparent that various modifications may fall within the scope of the appended claims.

What is claimed is:

1. A remote-controllable electronic device, comprising:
    a casing with a hole;
    a filter having a U-shape cross-section with an inner edge and an outer edge, a flat surface area of said outer edge of said filter being substantially the same size of and being embedded to said hole of said casing, wherein said flat surface area of said outer edge of said filter is substantially coplanar with an outer surface of said casing;
    a sensor disposed within said casing and configured to receive a light signal filtered by said filter; and
    a shielding element disposed on said inner edge of said filter by at least portion of the outer rim of said shielding element wedged with said inner edge of said filter and disposed in front of said sensor so as to specify a receiving range for said light signal received by said sensor in a specific direction;
    wherein an open angle is defined as the maximum angle of said light signal filtered by said filter and received by said sensor while in the absence of said shielding element in the specific direction, and a specific open angle of the specified receiving range is defined as the maximum angle of said light signal passed through said shielding element and received by said sensor in the specific direction, wherein said specific open angle is smaller than said open angle.

2. The remote-controllable electronic device of claim 1, wherein said casing further comprises a protrusion, said filter comprises a cavity, and wherein said protrusion is engaged with said cavity when said filter is embedded to said hole of said casing.

3. The remote-controllable electronic device of claim 1, wherein said light signal comprises a light signal emitted by a remote control.

4. The remote-controllable electronic device of claim 1, wherein said shielding element is disposed between said filter and said sensor so as to hinder a portion of said filtered light signal from being received by said sensor.

5. The remote-controllable electronic device of claim 1, wherein said shielding element is adhered to said filter.

6. The remote-controllable electronic device of claim 1, wherein said shielding element is a coating material coated on said filter.

7. The remote-controllable electronic device of claim 6, wherein said shielding element is disposed to define a portion of said filter as being a predetermined geometric shape.

8. The remote-controllable electronic device of claim 7, wherein said predetermined geometric shape comprises a circle, an oval, and a rectangle.

9. The remote-controllable electronic device of claim 1, wherein said receiving range comprises a horizontal receiving range and a vertical receiving range, and said shielding element is disposed so that said horizontal receiving range is larger than said vertical receiving range.

10. The remote-controllable electronic device of claim 1, wherein said receiving range comprises a horizontal receiving range and a vertical receiving range, and said shielding element is disposed so that said horizontal receiving range is substantially equal to said vertical receiving range.

11. The remote-controllable electronic device of claim 1, wherein said shielding element is movable along said inner edge of said filter so as to adjust said receiving range for said light signal.

12. The remote-controllable electronic device of claim 11, wherein said receiving range for said light signal is increased when said shielding element moves toward said sensor.

13. The remote-controllable electronic device of claim 11, wherein said receiving range for said light signal is decreased when said shielding element moves away from said sensor.

14. A remote-controllable electronic device, comprising:
    a casing with a hole;
    a filter having a U-shape cross-section with an outer edge, a flat surface area of said outer edge of said filter being substantially the same size of and being embedded to said hole of said casing, wherein said flat surface area of said outer edge of said filter is substantially coplanar with an outer surface of said casing;
    a sensor disposed within said casing and configured to receive a light signal filtered by said filter; and
    a shielding element directly coated on an inner surface of said filter so as to specify a receiving range for said light signal received by said sensor in a specific direction;
    wherein an open angle is defined as the maximum angle of said light signal filtered by said filter and received by said sensor while in the absence of said shielding element in the specific direction, and a specific open angle of the specified receiving range is defined as the maximum angle of said light signal passed through said shielding element and received by said sensor in the specific direction, wherein said specific open angle is smaller than said open angle.

15. A remote-controllable electronic device, comprising:
    a casing with a hole;
    a filter having a U-shape cross-section with an outer edge, a flat surface area of said outer edge of said filter being substantially the same size of and being embedded to said hole of said casing, wherein said flat surface area of said outer edge of said filter is substantially coplanar with an outer surface of said casing;
    a sensor disposed within said casing and configured to receive a light signal filtered by said filter; and
    a shielding element adhered to an inner surface of said filter so as to specify a receiving range for said light signal received by said sensor in a specific direction;
    wherein an open angle is defined as the maximum angle of said light signal filtered by said filter and received by said sensor while in the absence of said shielding element in the specific direction, and a specific open angle of the specified receiving range is defined as the maximum angle of said light signal passed through said shielding element and received by said sensor in the specific direction, wherein said specific open angle is smaller than said open angle.

* * * * *